United States Patent [15] 3,635,773
Thire [45] Jan. 18, 1972

[54] METHOD OF MANUFACTURING A SEMICONDUCTOR DEVICE COMPRISING A ZENER DIODE AND SEMICONDUCTOR DEVICE MANUFACTURED BY USING THIS METHOD

[72] Inventor: Jacques Thire, Caponiere-Caen, France
[73] Assignee: U.S. Philips Corporation, New York, N.Y.

[22] Filed: Dec. 13, 1968
[21] Appl. No.: 783,620

[30] Foreign Application Priority Data
Dec. 14, 1967 France....................................132205

[52] U.S. Cl..............................................148/191, 148/186
[51] Int. Cl...........................................................H01l 7/36
[58] Field of Search.................................148/191, 187, 188

[56] References Cited

UNITED STATES PATENTS 3,155,551 11/1964 Bennett.................................148/191
3,183,128 5/1965 Leistiko, Jr. et al...................148/187
3,255,056 6/1966 Flatley et al...........................148/191
3,391,035 7/1968 Mackintosh...........................148/187
3,404,450 10/1968 Karcher.................................29/577
3,490,964 1/1970 Wheeler................................148/191

*Primary Examiner*—Hyland Bizot
*Assistant Examiner*—J. Davis
*Attorney*—Frank R. Trifari

[57] ABSTRACT

A method for the manufacture of a Zener diode having a breakdown voltage in the range of 2.5 to 6 volts is described. This is obtained by using diffusion processes to form an abrupt PN-junction. The abrupt PN-junction results from out-diffusion of first impurities causing a reversed concentration gradient in a surface layer and in-diffusion of second impurities into that surface layer producing large concentration gradients that are opposite to one another. The method described is especially useful for the incorporation of Zener diodes in monolithic integrated circuits.

8 Claims, 14 Drawing Figures

INVENTOR.
JACQUES THIRE
BY
Frank R. Trifari
AGENT

INVENTOR.
JACQUES THIRE
BY
AGENT

INVENTOR.
JACQUES THIRE
BY
AGENT

METHOD OF MANUFACTURING A SEMICONDUCTOR DEVICE COMPRISING A ZENER DIODE AND SEMICONDUCTOR DEVICE MANUFACTURED BY USING THIS METHOD

The invention relates to a method of manufacturing a semiconductor device comprising a Zener diode, in which two impurities are diffused in a semiconductor body from the same surface to form the two adjoining diffused regions of opposite conductivity type of the Zener diode.

It is already known to manufacture voltage-limiting diodes which show the Zener effect and/or the avalanche effect, which diodes will hereinafter be referred to as Zener diodes. In linear and logic integrated circuits, an emitter-base diode is generally used which is biased in the forward direction and, at the level of the operating current of the said circuits, shows a substantially constant voltage with respect to the current level, said voltage being of the order of 0.6 to 0.7 v. Since the voltages to be limited in linear or logic circuits usually are a few volts, a number of diodes should be connected in series in the forward direction. However, it is not desirable to use more than three or four diodes, on the one hand since a plurality of diodes occupy too much space and the other hand since an increase of the number of circuit elements is to be avoided with a view to the reliability. Therefore, in this manner usually only Zener diodes are used for the voltage range between 0.6 and 2.5 volts.

For voltages higher than 6 volts, these diodes are used in the reverse direction.

If the diodes are integrated in a monolithic circuit, the two regions of the diode are obtained by two successive diffusions from the same surface of a semiconductor body, which diffusions may be carried out simultaneously with the diffusions of the bases and emitters of the transistors which are interpreted in the same circuit.

In the voltage range between 2.5 and 6 volts, no Zener diodes can be obtained by these methods. This voltage range is of particular importance for certain applications in linear circuits which receive a supply voltage of, for example, 6, 12 or 24 volts.

One of the objects of the present invention is to manufacture a semiconductor device having a Zener diode which is operative in the voltage range between 2.5 and 6 volts, in particular between 4 and 6 volts.

It is known that the breakdown voltage of a junction depends on its structure. For example, a junction between two regions having a high impurity concentration has a low breakdown voltage, but if one of the two regions has a low impurity concentration the breakdown voltage is high even when the second region is highly doped. This property is used in a method described in British Pat. No. 1,046,152, in which a Zener diode having a high breakdown voltage, at least higher than 15 volts, is provided in a semiconductor body comprising an epitaxial layer. One of the regions of this diode consists of a part of the low-doped epitaxial layer and the other region of the diode is a high-doped diffused region. The high breakdown voltage is to be ascribed here to the low-doped region which is a part of the epitaxial layer.

It is furthermore known that a junction between two regions the impurity concentration of which gradually decreases in a direction towards the junction (graded junction) has a comparatively high breakdown voltage, whereas a junction between two regions the impurity concentration of which strongly varies in the immediate proximity of the junction (abrupt junction) shows a lower breakdown voltage. The above-described Zener diodes which are obtained by two successive diffusions from the same surface of the semiconductor body have graded junctions.

Another object of the present invention is to provide a Zener diode which is operative in the voltage range between 2.5 and 6 volts and which is formed by an abrupt junction which may be used in the reverse direction.

The invention is inter alia based on the recognition of the fact that it is possible to obtain a diffused junction with the desired breakdown voltage which is substantially an abrupt junction by using out-diffusion, that is to say, by using a known process in which a semiconductor body, for example, after diffusion of a surface region, is subjected to a thermal treatment, the impurity present in the semiconductor body diffusing out of the semiconductor body so that the concentration of said impurity, particularly near the surface, is varied.

According to the invention, a method of manufacturing a semiconductor device comprising a Zener diode, in which two impurities are diffused in a semiconductor body from the same surface to form the two adjoining diffused regions of opposite conductivity type of the Zener diode is characterized in that after diffusing the first impurity with a high surface concentration, the sign of the concentration gradient of the impurity in a part of the first region adjoining the surface is reversed by out-diffusion, the second impurity having a high surface concentration and a large concentration gradient being then diffused into this part of the first region to form the second region, the said second region extending in the semiconductor body to at most the same depth as the part of the first region with reverse concentration gradient.

It is achieved in this manner that the concentration gradient of the two impurities in the proximity of the junction are opposite to each other so that an abrupt junction is obtained.

The concentration gradient of the first impurity in the immediate proximity of the junction depends upon the conditions under which the out-diffusion takes place. By the choice of, for example, the duration of the out-diffusion, the temperature of the semiconductor body at which, and the atmosphere in which the out-diffusion takes place, a large gradient with reverse sign may be obtained. Furthermore, the concentration gradient of the second impurity may also be large, particularly when a diffusion treatment with a short duration is used.

In the method according to the invention the surface concentration of the first impurity which is one of the determining factors for the breakdown voltage can readily be controlled by using out-diffusion.

The invention is of particular importance for manufacturing integrated semiconductor devices and enables in a simple manner the incorporation of a Zener diode with the desired breakdown voltage in an integrated monolithic semiconductor device without many extra processes being required for that purpose.

An important embodiment of the method according to the invention is characterized in that the first region and insulation regions of the other conductivity type for the mutual insulation of various parts of the surface layer are simultaneously provided in a surface layer of one conductivity type of the semiconductor body by diffusion of the same first impurity.

The out-diffusion is preferably carried out during the diffusion treatment(s) in which regions of one or more further circuit elements of the semiconductor device are provided. The regions of said circuit elements may be diffused from a previously provided prediffused region. The only extra treatment which is required for providing the diode is the diffusion of the second impurity, which treatment may be very short so that the regions provided previously in the semiconductor body experience substantially no adverse influence.

The out-diffusion is preferably carried out at a temperature of at least 1,000° C. while furthermore very good results are obtained when the out-diffusion is carried out in a dry oxygen atmosphere.

The element boron is particularly suitable as a first impurity.

In order to be able to provide the first region with a conductive contact in a simple manner, it is recommendable to prevent out-diffusion in a surface part of the first region. This surface part may then be used as a contact region.

The invention furthermore relates to semiconductor devices comprising a Zener diode manufactured by using the invention.

In order that the invention may be readily carried into effect, it will now be described in greater detail, by way of example, with reference to the accompanying drawings, in which FIG. 1 shows the concentration variation of the diffused impurities as a function of the depth in the case of a diode obtained in known manner.

FIG. 2 shows the corresponding variation of the concentration for a diode obtained according to the method of the invention.

FIGS. 3*a* to 3*j* are diagrammatic cross-sectional views of a first embodiment of a semiconductor device comprising a Zener diode and an NPN-transistor in various stages of manufacture according to the method of the invention.

Figures 1, 2:
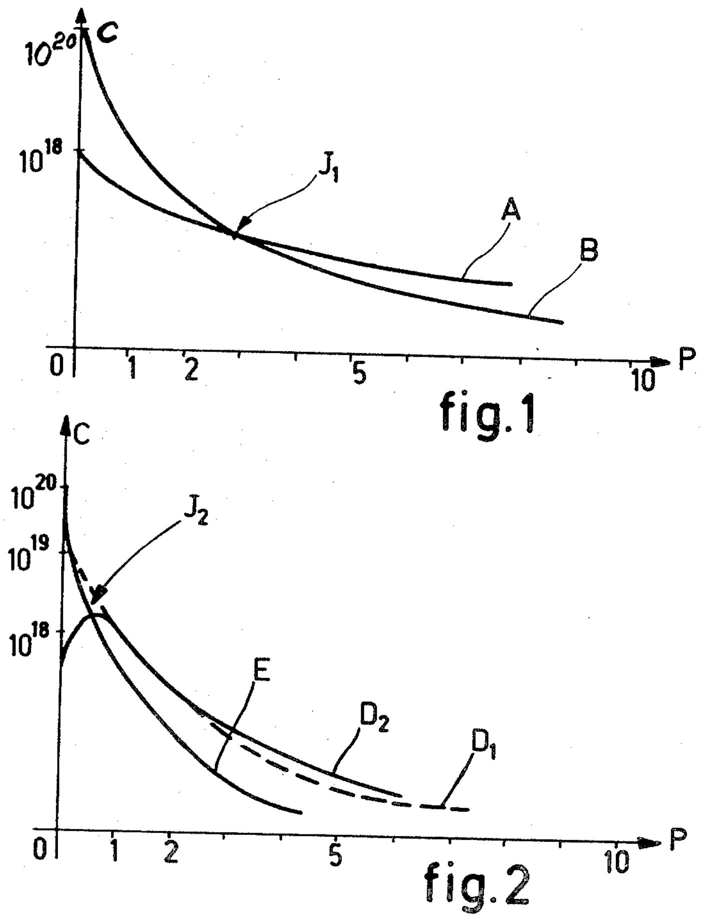

Curve A in FIG. 1 shows the concentration variation of the impurity concentration C expressed in atoms/cc. as a function of the depth P expressed in $\mu$m as it is obtained by carrying out a first diffusion from a surface in a semiconductor body. Curve B shows a similar variation for the concentration of an impurity which produces a conductivity type opposite to that of the impurity which is used in the first diffusion, which variation is obtained by a second diffusion from the same surface. These two diffusions are carried out according to the normal methods of obtaining an integrated Zener diode in a monolithic circuit. The two diffusion fronts move in the same direction at various rates, as a result of which a junction is formed at $J_1$ which is termed a graded junction owing to the small gradient of the impurity concentrations of the two impurities in the proximity of the said junction and due to the fact that the concentrations decrease in the same direction.

The broken-line-curve $D_1$ in FIG. 2 shows the variation of the concentration C (atoms/cc.) as a function of the depth P ($\mu$m) obtained by means of a first diffusion from the surface. The solid-line-curve $D_2$ shows the variation of the concentration after using an out-diffusion treatment. The variation as a function of the depth has varied with respect to curve $D_1$ and particularly near the surface the sign of the gradient has reversed. Curve E shows the concentration variation of an impurity of the opposite type which is obtained by means of a diffusion with a short duration from the same surface. At the point of intersection of the curves $D_2$ and E, a junction $J_2$ is formed which is termed an abrupt junction owing to the large gradient of the impurity concentrations in the proximity of the junction.

FIGS. 3*a* to 3*j* show various stages of manufacturing a semiconductor device comprising inter alia a Zener diode according to the invention. These Figures only show a diode and, by way of example, a transistor, but it will be obvious that other electrical circuit elements, both passive and active, can be combined with a Zener diode in an integrated circuit.

It is to be noted that the dimensions in the Figures are not shown in the correct proportions for clarity. Furthermore, the masking oxide layers are not shown, while in the description said oxide layers are not always mentioned either, since these layers and windows in said layers at the desired locations can be provided entirely in a manner which is commonly used in semiconductor technology.

In the example shown in FIGS. 3*a* to 3*j* the surface region of the diode is of the same conductivity type as the surface layer of the semiconductor body in which it is provided. The said surface layer is, for example, an epitaxial layer which is provided on a substrate of the opposite conductivity type. In the present example, the transistor, the diode and any other circuit elements which are not shown are insulated from each other and from a substrate which is formed by the said base by insulation regions which are obtained by diffusing from the surface an impurity of a conductivity type which is opposite to that of the surface layer, the insulation regions thus obtained which extend in the substrate surrounding together with said substrate, parts of the surface layer which are insulated from each other. In this example the surface layer is N-type and the substrate is P-type.

On a surface 2 of a monocrystalline P-type semiconductor body 1 (FIG. 3*a*) a prediffused P-type region 3 is provided at locations corresponding to the required insulation region. A second prediffused N-type region 4 (FIG. 3*b*) is then provided from which by diffusion a buried layer for the collector of the transistor can be formed.

An N-type epitaxial layer 5 (see FIG. 3*c*) is then provided on the surface 2.

On the surface 6 of the layer 5 which constitutes the abovementioned surface layer of the semiconductor body a prediffused region 7 (FIG. 3*d*) is provided at locations corresponding to the regions 3, and a prediffused region 8 is provided from which one of the regions of the diode can be diffused. In this case it is of importance that after diffusion the concentration at the surface is very high.

Figure 3A:
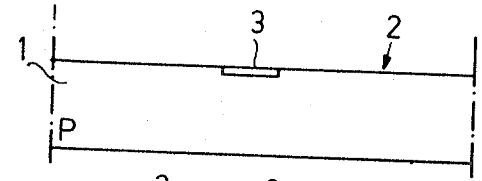
Figure 3B:
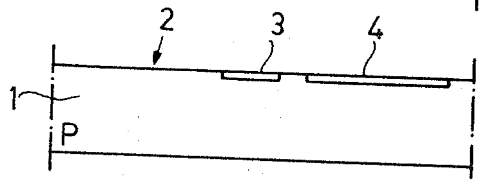
Figure 3C:
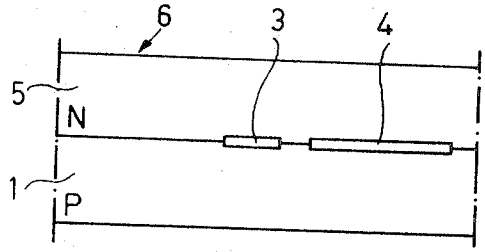
Figure 3D:
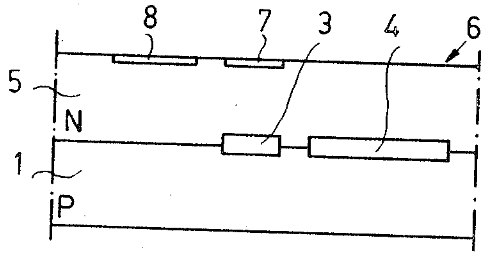
Figure 3E:
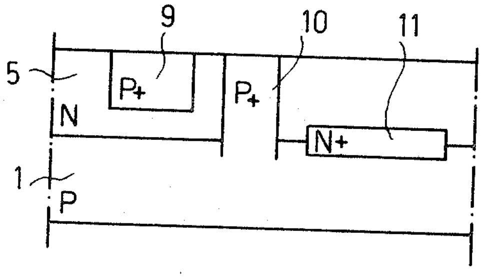

In the subsequent treatment, regions are diffused from the prediffused regions, which regions are diagrammatically shown in FIG. 3*e*.

The region 9 of the diode shows a variation of the impurity concentration as is represented by the curve $D_1$ of FIG. 2, the surface concentration being chosen to be sufficiently high to obtain a high surface concentration also after the out-diffusion.

Figure 3F:
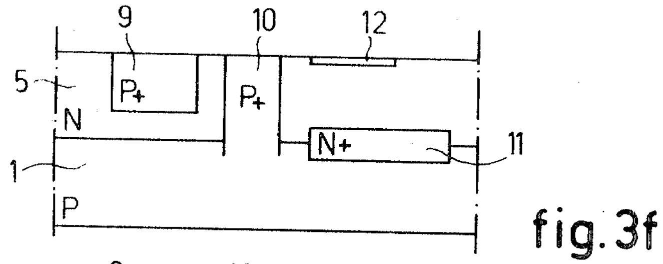
Figure 3G:
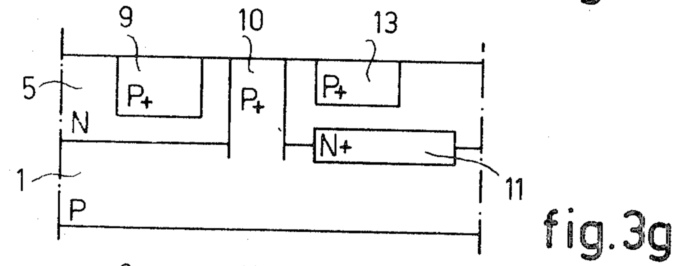
Figure 3H:
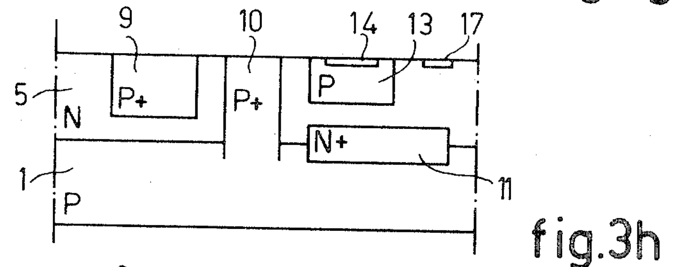
Figure 3I:
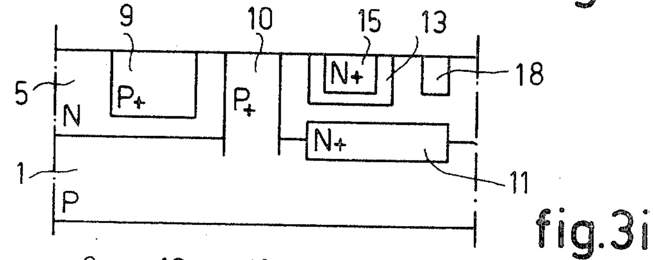

By diffusion from the prediffused regions 3 and 7, continuous regions 10 are formed with which the various elements which are surrounded by said regions are insulated. The buried layer 11 of the transistor is formed by the diffusion from the prediffused region 4. A prediffused region 12 is thus provided from which the base of the NPN-transistor is formed (FIG. 3*f*).

During the diffusion in which the region 13 is formed (FIG. 3*g*) the surface of the region 9 is left unmasked in order to effect near said surface a first out-diffusion of the impurities.

Prediffused N+-type regions 14 and 17 are then provided from which the emitter 15 of the transistor and the contact regions 18 for the collector of the transistor are diffused (FIG. 3*h*), a second out-diffusion in the region 9 taking place during the said diffusion by leaving the surface of the said region 9 unmasked. After these treatments the region 9 shows a variation of the impurity concentration as represented by the curve $D_2$ of FIG. 2.

Figure 3J:
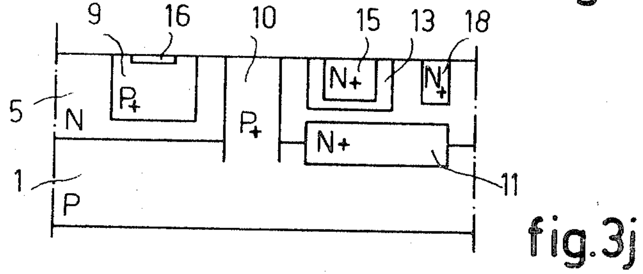

The next step in the method according to the invention is the diffusion for the formation of the second region 16 of the diode (FIG. 3*j*). In order to obtain a shallow N+ region having a high surface concentration and a large gradient, this diffusion is carried out at a comparatively high temperature and for a short period of time.

The device may be completed with contacts at the various regions of the circuit elements, which contacts may be provided by vapor deposition in a vacuum.

Figure 4:
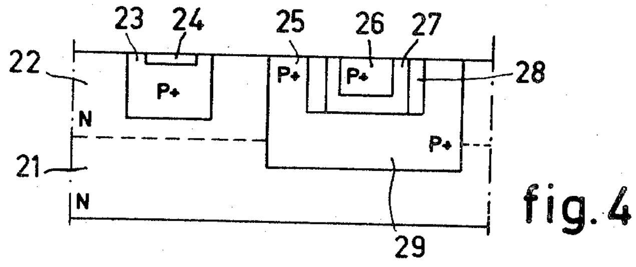
FIG. 4 is a diagrammatic cross-sectional view of a second embodiment of a semiconductor device according to the invention comprising a Zener diode and a transistor.

FIG. 4 shows a semiconductor device having a diode as described with reference to FIG. 3 and a transistor which is complementary to that of FIG. 3.

The substrate from which is started comprises a surface layer 21, for example, of N-type conductivity. A prediffused region is provided in it at a location corresponding to the region 29 of the collector of the transistor. An epitaxial layer 22 of the same conductivity type is then provided on the layer 21. The region 25 with an annular, at least closed, geometry, which together with the region 29 forms the collector, and the anode 23 of a Zener diode are then simultaneously diffused under conditions as described for the anode 9 with reference to FIG. 3*e*. The region 28 which is surrounded by the regions 25 and 29, may constitute the base of the transistor, but it is often desirable to provide a region 27 of the same conductivity type as the region 22. In this manner a base is obtained having a concentration gradient which improves the characteristics of the transistor. During the diffusion of the region 27 according to the invention, a first out-diffusion out of the region 23 is carried out, the out-diffusion being completed during the diffusion of the emitter 26. The second region of the diode is diffused in the same manner as described in the previous example.

Figure 5:
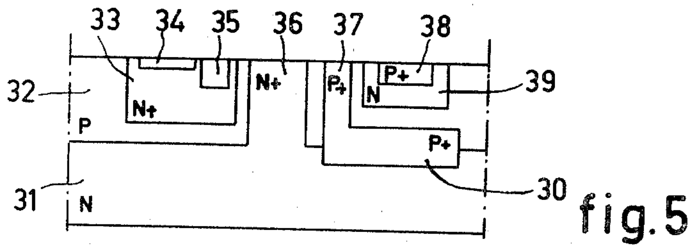
FIG. 5 is a diagrammatic cross-sectional view of a third embodiment of a semiconductor device comprising a transistor and a Zener diode according to the invention.

The embodiment shown in FIG. 5 comprises an N-type substrate 31 on which a P-type epitaxial layer 32 is provided. The manufacture may be carried out in a manner entirely analogous to that of the example described with reference to FIGS. 3*a* to 3*j*. The insulation regions are denoted by 36, the collector of the transistor comprises a buried layer 30 and a contact region 37, while the base and the emitter of the transistor are denoted by 39 and 38 respectively. The diode comprises a region 33 in which, according to the invention, out-diffusion has been used and a region 34 which has been obtained by a short diffusion. Preferably, particularly when the semiconductor body consists of silicon and the first region of the Zener diode is of N-type conductivity, out-diffusion is checked over part of the region 33, so that a contact region 35 is formed in which the maximum impurity concentration is maintained so as to be able to provide a good ohmic contact.

The most important steps of the manufacture of a semiconductor device having a diode and an NPN-transistor as described with reference to FIGS. 3*a* to 3*j* will now be described by way of example.

Two prediffused regions are provided on the surface of a monocrystalline P-type silicon body 1 having a thickness of approximately 150 $\mu$m and a resistivity of the order of a few ohm.cm., which contains as an impurity boron with a concentration of approximately $3\times10^{15}$ atoms/cm. One of the regions comprises arsenic having a surface concentration of $10^{20}$ atoms/cc. and is destined to form the buried layer of the collector of the transistor. The other region comprises boron having a surface concentration of $10^{19}$ atoms/cc. and is destined to form the insulation region. The epitaxial layer which is then provided on the body contains as an impurity phosphorus having a concentration of $10^{16}$ atoms/cc. said layer being of N-type conductivity and having a resistivity of the order of 0.5 ohm.cm. and a thickness of approximately 10 $\mu$m.

The insulation regions are completed by the diffusion of boron from the surface of the epitaxial layer, the anode of the zener diode being simultaneously provided. The surface concentration is approximately $10^{19}$ atoms/cc. and the diffusion time is approximately 1 hour. A prediffused region for the base of the transistor is then provided, in which boron is also used in this case with a surface concentration of $10^{18}$ atoms/cc. During the subsequent diffusion which takes place, for example for 80 minutes at a temperature of 1,200° C. in a dry oxygen atmosphere, the surface of the anode of the diode is uncovered so that out-diffusion takes place.

Prediffused regions for the emitter and the collector contact of the transistor are then provided, the impurity being phosphorus having a surface concentration of $10^{20}$ atoms/cc. During the subsequent diffusion at a temperature of approximately 1,000° C. in a dry atmosphere and a duration of approximately 30 minutes the out-diffusion for the anode of the diode is continued.

The cathode of the diode is then diffused with phosphorus having a surface concentration of $10^{20}$ atoms/cc., which diffusion lasts maximally to 10 minutes.

Finally, the required contacts may be provided in normal manner, for example, by vapor-deposition of a metal layer in a vacuum.

Of course the above-described embodiments may be varied by using equivalent technical means without departing from the scope of the present invention. For example, other semiconductor materials, for example, germanium, or $A_{III}B_{V}$ compounds may be used. Furthermore, more than one Zener diode and more than one transistor may be provided in an integrated circuit, while also other circuit elements, for example, field-effect transistors, resistors and capacitances may be used.

What is claimed is:

1. A method of manufacturing a Zener diode comprising the steps of diffusing into a semiconductor body portion from a surface thereof first impurities of the one conductivity type in a relatively high surface concentration to convert a first region of the body portion into one conductivity type, thereafter heating the body under conditions causing the first impurities from a surface layer of the first region to out-diffuse therefrom producing a first impurity distribution within the first region having a maximum value, a decreasing concentration gradient deeper into the region, and a reversed decreasing concentration gradient from the depth of the surface layer to the said surface, thereafter diffusing into the first region from the said surface second impurities of the opposite conductivity type in a surface concentration higher than that remaining of the first impurity at the surface to convert a surface portion of the first region to a second region having the opposite type conductivity, said second region having a large second impurity concentration gradient and being shallow with a depth less than the said surface layer containing the reversed concentration gradient whereby an abrupt PN-junction having a reverse breakdown voltage in the range of 2.5–6 volts is formed where the large impurity distribution of the in-diffused second impurities intersects the reversed impurity distribution of the out-diffused first impurities.

2. A method as set forth in claim 1 wherein the abrupt PN-junction is formed where the first and second impurity distributions exceed $10^{18}$ atoms/cc.

3. A method as set forth in claim 1 in the manufacture of a monolithic integrated circuit comprising in addition to the Zener diode further circuit elements, wherein the body portion comprises an epitaxial layer of the opposite conductivity type, and simultaneously with the diffusion of the first impurities to form the first region further first impurities are diffused to form isolation channels to isolate the circuit elements.

4. A method as set forth in claim 3 wherein the out-diffusion of the first impurities is carried out while simultaneously regions of a further circuit element are being diffused.

5. A method as set forth in claim 2 wherein part of the surface of the first region is covered during the out-diffusion step to reduce out-diffusion therefrom, and a contact is later made to the said surface part to establish a connection to the first region.

6. A method as set forth in claim 2 wherein the out-diffusion step is carried out at a temperature of at least 1,000° C.

7. A method as set forth in claim 2 wherein the out-diffusion step is carried out in a dry oxygen atmosphere.

8. A method as set forth in claim 6 wherein the first impurities are boron.

* * * * *